United States Patent
Hsiao et al.

(10) Patent No.: US 7,922,512 B2
(45) Date of Patent: Apr. 12, 2011

(54) SOCKET CONNECTOR HAVING MOVABLE FRAME WITH ACTUATING MEMBER

(75) Inventors: Shih-Wei Hsiao, Tu-Cheng (TW); Hsiu-Yuan Hsu, Tu-Cheng (TW); Wen-Yi Hsieh, Tu-Cheng (TW); Ke-Hao Chen, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/753,117

(22) Filed: Apr. 2, 2010

(65) Prior Publication Data
US 2010/0255706 A1 Oct. 7, 2010

(30) Foreign Application Priority Data
Apr. 3, 2009 (TW) .............................. 98205417 U

(51) Int. Cl.
*H01R 13/62* (2006.01)
(52) U.S. Cl. ...................................................... 439/331
(58) Field of Classification Search .................. 439/331, 439/70–73, 330
See application file for complete search history.

(56) References Cited

U.S. PATENT DOCUMENTS

| | | | | |
|---|---|---|---|---|
| 5,161,984 A * | 11/1992 | Taylor et al. | ..................... | 439/73 |
| 5,290,193 A * | 3/1994 | Goff et al. | ..................... | 439/331 |
| 5,322,446 A * | 6/1994 | Cearley-Cabbiness | ......... | 439/73 |
| 5,646,447 A * | 7/1997 | Ramsey et al. | ............... | 439/331 |
| RE36,217 E * | 6/1999 | Petersen | ..................... | 439/261 |
| 5,989,039 A * | 11/1999 | Sik | ..................... | 439/73 |
| 6,162,066 A * | 12/2000 | Glick et al. | ..................... | 439/73 |
| 6,368,137 B1 * | 4/2002 | Orwoll | ..................... | 439/331 |
| 7,670,166 B2 * | 3/2010 | Hsieh | ..................... | 439/330 |
| 2008/0293285 A1 | 11/2008 | Hsieh | | |

* cited by examiner

Primary Examiner — Briggitte R Hammond
(74) Attorney, Agent, or Firm — Andrew C. Cheng; Wei Te Chung; Ming Chieh Chang

(57) ABSTRACT

A socket connector comprises an insulating base receiving a plurality of contacts, a movable frame assembled to the insulating base, at least one latch device pivotally assembled to the insulating base, and at least one actuating member corresponding to the latch device and retained on a sidewall of the movable frame. The at least one actuating member includes a driving portion disposed at inner edge of the sidewall of the movable frame and extending downwardly. The movable frame is able to move up and down relative to the insulating base. Each latch device includes a latching member having a pressing portion with a cuneiform outside surface. When the actuating member moves up and down together with the movable frame, the driving portion of the actuating member pushes the cuneiform outside surface of the pressing portion of the latch device to shift between a closed position and an opened position.

16 Claims, 5 Drawing Sheets

SOCKET CONNECTOR HAVING MOVABLE FRAME WITH ACTUATING MEMBER

BACKGROUND OF THE INVENTION

1. Field of the Invention

The present invention relates to an electrical connector, and more particularly to a burn-in socket having latching members actuated by a plurality of actuating members assembled on a movable frame to rotate between an opened position and a closed position.

2. Description of the Related Art

Conventionally, a burn-in socket is used to mount an IC package for various testing, in which IC package is loaded into or loaded out frequently for connecting or disconnecting with terminals electrically therein.

U.S. Patent Application Publication No. 20080293285 submitted by HSIEH and published on Nov. 27, 2008 discloses a typical burn-in socket for interconnecting an IC package and a test board. The burn-in socket includes a base, an actuating device assembled on said base, a frame retained on said base, a plurality of contacts received in said base and a plurality of switch members pivotally assembled on said base. Said actuated device includes a plurality of metal sustaining shafts with a plurality of rollers rotationally disposed mounted thereon. Said switch member further includes a plurality of rotating shafts retained on said base and a plurality of latching members engaging with said rotating shafts and rotating between an opening position and a locking position. Said rollers of sustaining shafts moveable engage with said latching member while the latching members rotate between said opening position and said locking position and around said rotating shafts.

However, in the conventional burn-in socket, when the latching members rotate between the opening position and the locking position, the latching member and the metal sustaining shafts have a relative motion therebetween, which usually causes a heavy abrasion and a big loss in efficiency between the latching members and the shafts. On the other hand, the latching member has a plurality of sustaining shafts with a plurality of rollers, so the switch member usually defines a complicated structure. So it increases some difficulties in operating and assembling of the burn-in socket.

Hence, an improved burn-in socket is required to overcome the disadvantages of the prior art.

SUMMARY OF THE INVENTION

An object of the invention is to provide a socket connector, which has a movable frame with actuating members to push latching members of the socket to rotate between an opened position and a closed position.

To achieve the above-mentioned object, a socket connector comprises an insulating base receiving a plurality of contacts, a movable frame assembled to the insulating base, at least one latch device pivotally assembled to the insulating base, and at least one actuating member corresponding to the latch device and retained on a sidewall of the movable frame. The at least one actuating member includes a driving portion disposed at inner edge of the sidewall of the movable frame and extending downwardly. The movable frame moves up and down relative to the insulating base. Each latch device includes a latching member having a pressing portion with a cuneiform outside surface. When the actuating member moves up and down together with the movable frame, the driving portion of the actuating member pushes the cuneiform outside surface of the pressing portion of the latch device to shift between a closed position and an opened position.

Other features and advantages of the present invention will become more apparent to those skilled in the art upon examination of the following drawings and detailed description of preferred embodiments, in which:

DETAILED DESCRIPTION OF PREFERRED EMBODIMENT

The present invention shall be discussed hereinafter in terms of a preferred embodiment illustrated in the accompanying drawings. In the following description, numerous specific details are set forth in order for the reader hereof to gain a thorough understanding of the present invention. It will be obvious, however, to those skilled in the art that certain well-know elements may not be shown in detail in order to unnecessarily obscure the present invention.

Figure 1:
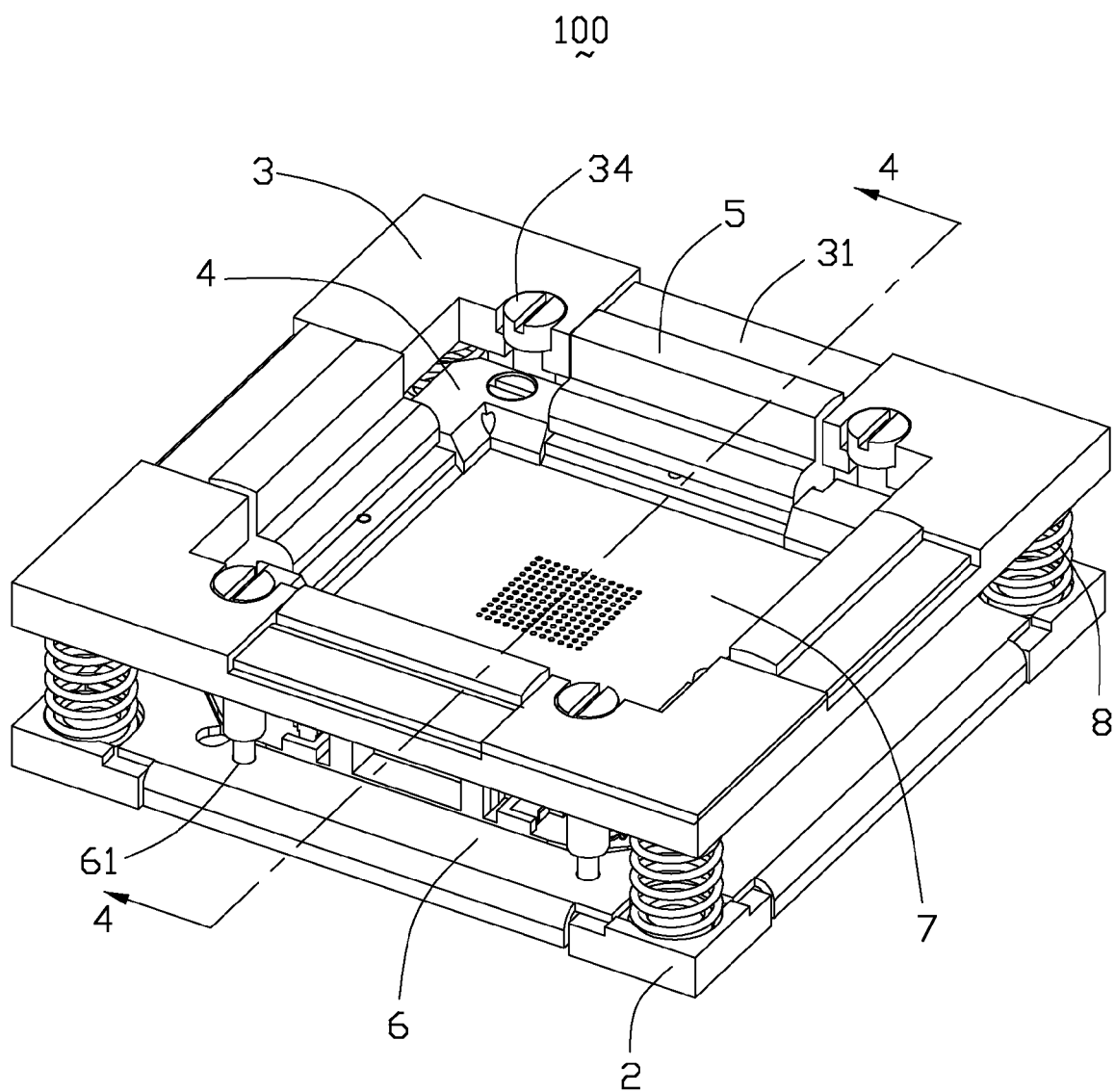
FIG. 1 is an assembled, perspective view of a socket connector in accordance with a preferred embodiment of the present invention.
Figure 2:
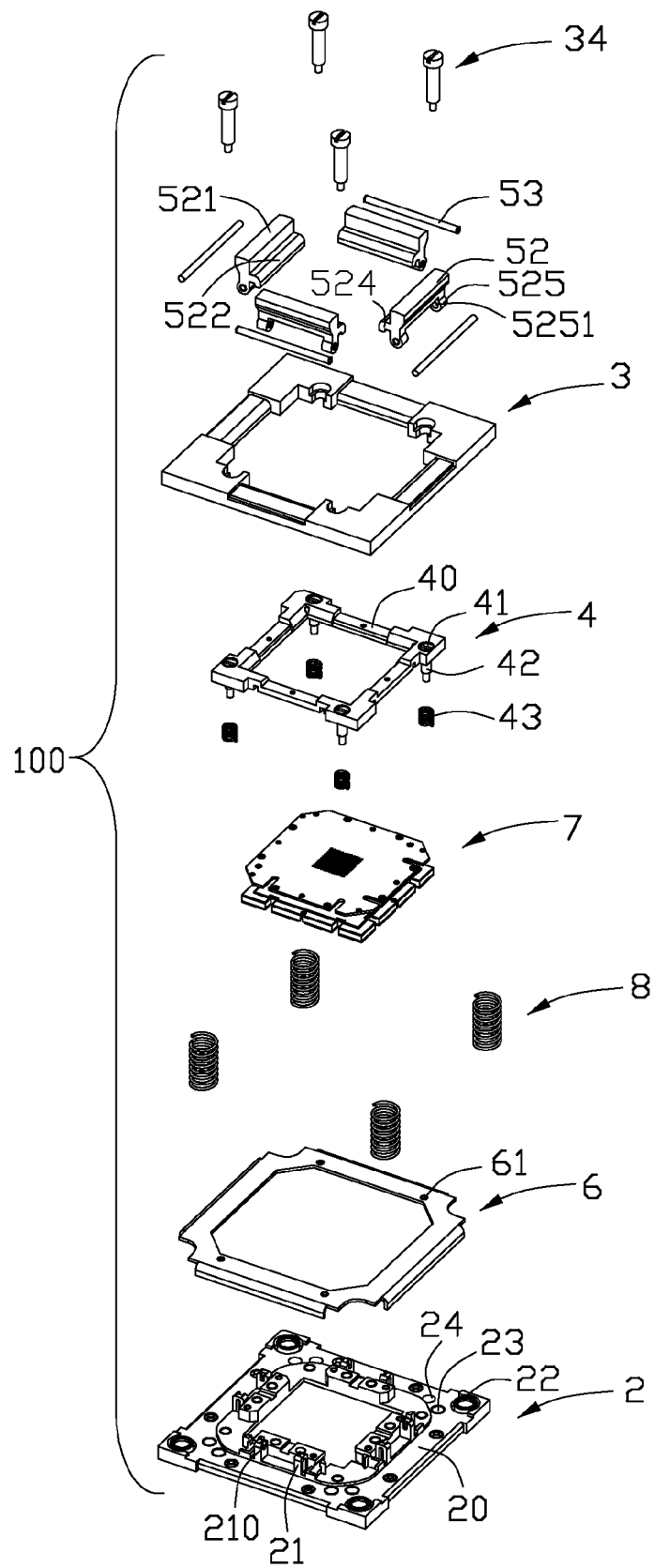
FIG. 2 is an exploded, perspective view of the socket connector in FIG. 1.
Figure 3:
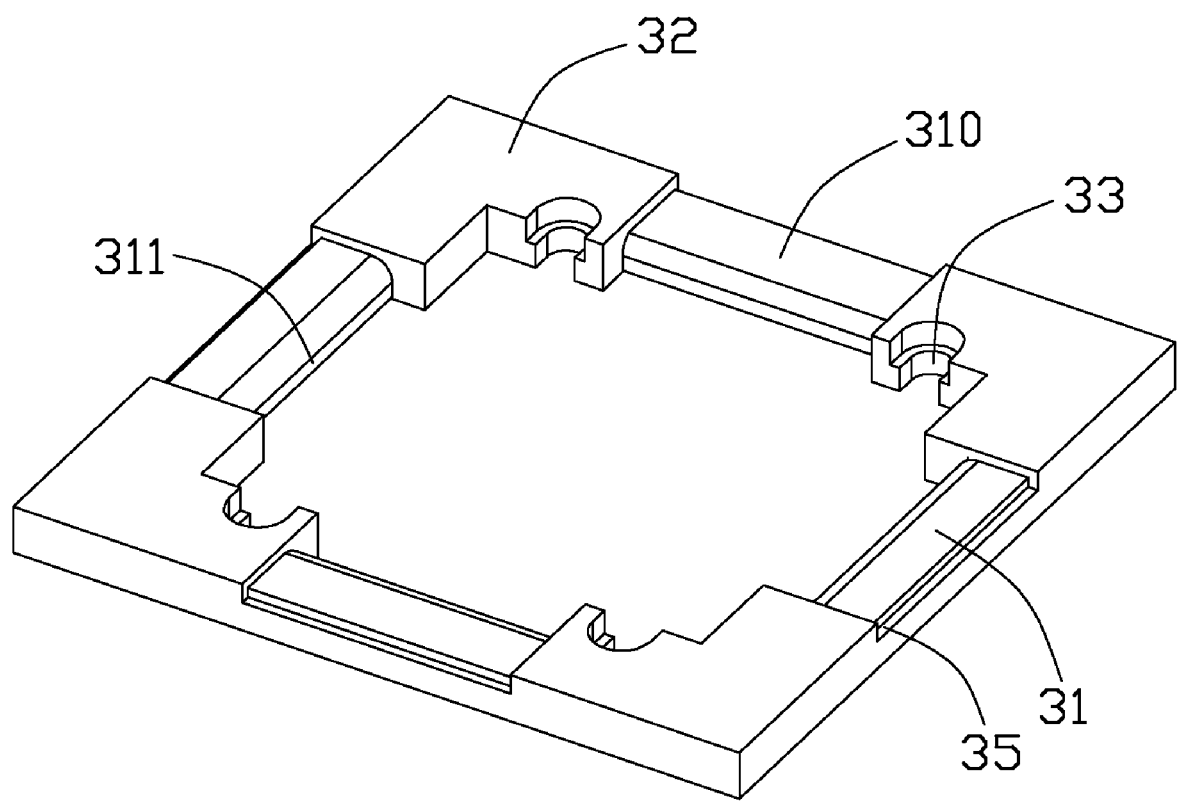
FIG. 3 is a perspective view of a movable frame of the socket connector.

Referring to FIGS. 1-2, a burn-in socket 100 in accordance with the preferred embodiment of the present invention is adapted to electrically connect a semiconductor package (not shown) to a printed circuit board (not shown). The burn-in socket 100 includes a socket body for receiving the semiconductor package (not shown) therein, a plurality of contacts 1 received in the socket body for electrical connection with the semiconductor package (not shown), and a movable frame 3 mounted upon the socket body, four latch devices 5 assembled on the socket body. The movable frame 3 can be operated between an upper position and a lower position to drive the latch devices 5 to rotate between an opened position and a closed position.

The socket body includes a base 2, a securing frame 4 seated on the base 2 by a plurality of first bolts 34, a retaining board 7 received in the securing frame 4 for retaining the contacts 1 which are arranged in a matrix array, and an enforcing element 6 assembled on the base 2 to strengthen the socket body. A plurality of first springs 8 are retained on four corners of the base 2 and located between the movable frame 3 and the base 2 for sustaining movement of the movable frame 3 between the upper position and the lower position.

Referring to FIG. 2, the base 2 has a rectangular shape and includes a main body 20 and a plurality of supporting posts 21 extending upwardly from the main body 20. Each supporting post 21 defines a first shaft hole 210 thereon for being used to assemble the latch device 5 on the base 2. The main body 20 defines four apertures 22 on four corners thereof respectively for receiving the first springs 8 therein to provide reciprocal forces for the movable frame 3. The base 1 is provided with a plurality of positioning holes 23 near the apertures 22 for fastening the securing frame 4. The main body 20 of the base 2 further defines a plurality of through holes 24 adjacent to the positioning holes 23 for the first bolts 34 passing through so as to secure the movable frame 3 and the enforcing member 6 within the base 2.

The movable frame 3 is of a rectangular frame and made of insulating material and has four sidewalls 32. The movable frame 3 is formed with four rectangular flat roofs 35 respectively downwardly recessed from a center part of the four sidewalls 32 thereof. Four metal actuating members 31 are retained on the flat roofs 35 by insert-molding. Each actuating member 31 includes a main portion 310 mounted on a top surface of the flat roof 35 and a driving portion 311 extending downwardly from inner edge of the main portion 310. The driving portion 311 is located at inner edge of the sidewall 32 and generally vertical to the sidewall 32 of the movable frame 3. When the movable frame 3 is operated between the upper position and the lower position, the driving portion 311 abuts against the latch device 5 and impels the latch device 5 to rotate between the opened position and the closed position. Four U-shaped guiding slots 33 are recessed outwardly from two opposed inner side surface of the sidewalls 32 near corners of the movable frame 3 for engaging with the first bolts 34.

The securing frame 4 has a rectangular shape and includes four walls 41 connecting with each other. Four fixing holes 41 are formed at four corners of the walls 41 for a plurality of second bolts 42 passing through for retaining the securing frame 4 on the base 2. A plurality of second spring 43 are assembled on the second bolts 42 and located between the securing frame 4 and the base 2.

Figure 4:
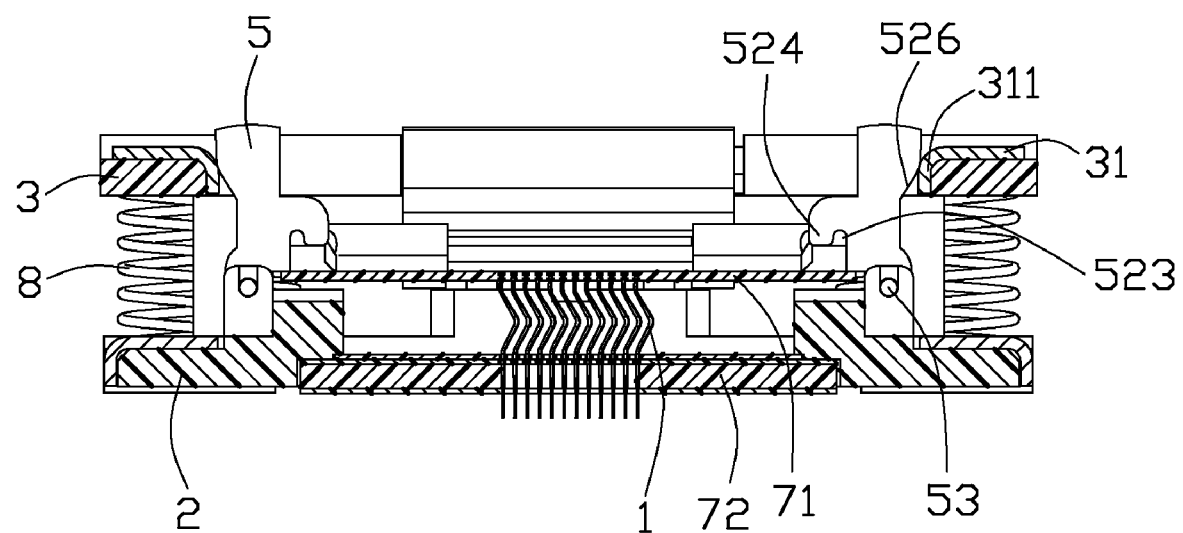
FIG. 4 is a cross-sectional view of the socket connector taken along line 4-4 in FIG. 1, showing latch devices of the socket connector at a closed position.
Figure 5:
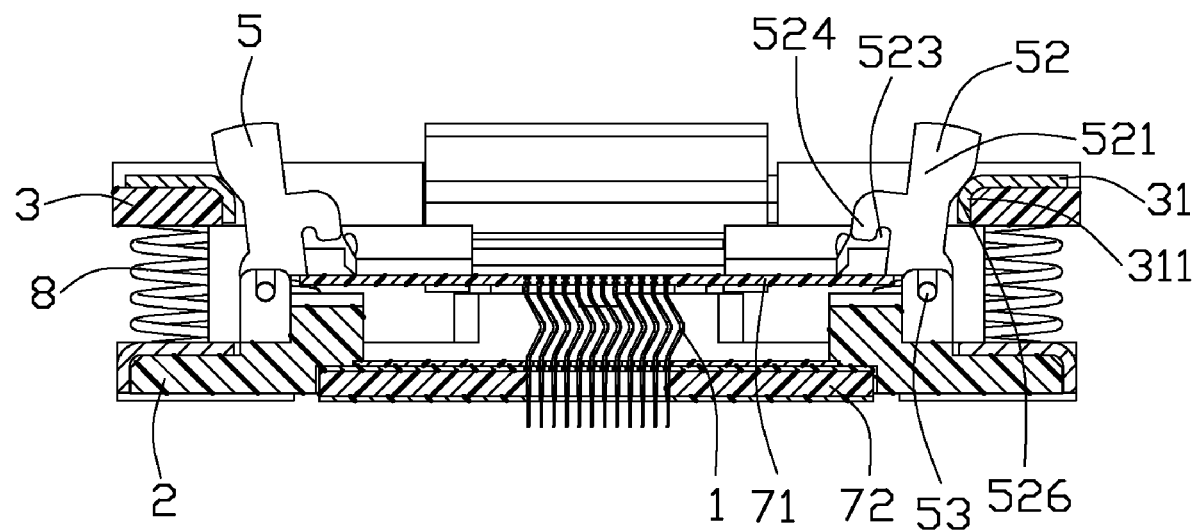
FIG. 5 is another cross-sectional view of the socket connector in FIG. 1, showing the latch devices at an opened position.

Referring to FIGS. 2, 4 and 5, each latch device 5 includes a latching member 52 for locking the semiconductor package (not shown) and a rotating shaft 53 pivotally assembled on the base 2. Each latching member 52 is substantial L-shaped and has a pressing portion 521 and a locking portion 522 extending horizontally and inwardly from said pressing portion 521. The pressing portion 521 includes a pair of downwardly protruding securing portions 525 at two opposite bottom ends thereof. The securing portions 525 define a pair of shaft holes 5251 for engaging with the corresponding rotating shaft 53 to assemble the latching member 52 on the insulating base 2. The locking portion 522 defines a groove 523 engaging with the securing frame 4 for pressing the semiconductor package (not shown). The pressing portion 521 has a cuneiform surface 526 formed on the back side face of the pressing portion 521 for engaging with the actuating member 31 of the movable frame 3. The latching member 52 rotates around the rotating shaft 53 between the closed position and the opened position while the slanted surface 526 is sustained by the driving portion 311 of the actuating member 31 of the movable frame 3.

The enforcing element 6 is assembled on the base 2. The enforcing element 6 defines four bores 61 at four corners thereof corresponding to the through holes 24 of the base and the guiding slots 33 of the movable frame 3 for the first bolts 34 passing through.

The retaining board 7 includes an upper clapboard 71 and a lower clapboard 72 spaced with the upper clapboard 71 and parallel to each other. The upper clapboard 71 and the lower clapboard 72 respectively define a plurality of terminal-holes for receiving the contacts 1.

Referring to FIGS. 1, 4 and 5, when the movable frame 3 is pressed downwardly to the base 2, the first springs 8 are compressed downwardly and the actuating member 31 moves downwardly with the movable frame 3, at the same time, the latching members 52 are pushed by the springs (not shown) on a bottom face thereon to rotate outwardly around the rotating shaft 53. During this process, the cuneiform surface 526 of each latching member 52 is moveably sustained by the driving portion 311 of the actuating member 31. When the movable frame 3 resists on the enforcing element 6 and reaches a lowest position, the latching members 52 rotate to the opened position and the semiconductor package (not shown) is assembled on the securing frame 4. Conversely, the movable frame 3 is shifted upwardly by restoring of the first springs 8 when the exterior force on the movable frame 3 is withdrawn. The driving portions 311 of the actuating members 31 are shifted upwardly with the movable frame 3 together, and pushes the cuneiform surfaces 526 upwardly and makes the latching members 52 rotate inwardly around the rotating shafts 53 to the closed position and press with the semiconductor package (not shown) in the burn-in socket 100.

Since, the latching members 52 can rotate from the opening position to the closed position when pushed by the actuating members 31 of the movable frame 3. Thus, the actuating members 31 replace a plurality of metal sustaining shafts with a plurality of rollers ringed thereon in the conventional burn-in socket. And it lowers the abrasion and improves the operating efficiency and simplifies the structure of the burn-in socket 100. Additionally, the metal actuating members 31 have simple structures and increase rigidity of the movable frame 3. Even if the latching members 52 fail to work normally, it only needs to take off the movable frame 3 easily and assemble new latching members 52 on the base 2.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket comprising:
an insulating base receiving a plurality of contacts;
a movable frame assembled to the insulating base and moving up and down relative to the insulating base;
at least one latch device pivotally assembled to the insulating base, each latch device including a latching member having a pressing portion with a cuneiform outside surface; and
at least one actuating member corresponding to the latch device and retained on a sidewall of the movable frame, and the at least one actuating member including a driving portion disposed at inner edge of the sidewall of the movable frame and extending downwardly, when the actuating member moving up and down together with the movable frame, the driving portion of the actuating member pushing the cuneiform outside surface of the pressing portion of the latch device to shift between a closed position and an opened position.

2. The socket as claimed in claim 1, wherein the movable frame is made of insulating material, the actuating member is made of metal, and the actuating member is retained on the movable frame by insert-molding.

3. The socket as claimed in claim 2, wherein at least one flat roof is downwardly recessed from a center part of a sidewall of the movable frame, and the actuating member includes a main portion mounted on a top surface of the flat roof, and the driving portion extends downwardly from an inner edge of the main portion.

4. The socket as claimed in claim 3, wherein the latch device includes a rotating shaft to link the latch member to the base.

5. The socket as claimed in claim 3, wherein each latching member is substantial L-shaped and further has a locking portion extending horizontally and inwardly from said pressing portion.

6. The socket as claimed in claim 4, wherein the pressing portion is formed with a pair of downwardly protruding securing portions, the securing portions define a pair of shaft holes for engaging with the rotating shaft to assemble the latch member to the insulating base.

7. The socket as claimed in claim 3, wherein the socket includes a plurality of first springs retained on four corners of the base and located between the movable frame and the base for sustaining the movable frame moving between an upper position and a lower position.

8. A burn-in socket for receiving a semiconductor package comprising:
   a socket body for carrying the semiconductor package;
   a plurality of contacts received in the socket body for electrically connecting with the semiconductor package;
   a movable frame movable relative to the socket body in a vertical direction;
   at least one latch device pivotally mounted on the socket body; and
   at least one actuating member mounted on a sidewall of the movable frame, the at least one actuating member including a main portion retained on a top surface of the sidewall of the movable frame and a driving portion extending downwardly from inner edge of the main portion, the at least one actuating member moving up and down together with the movable frame to drive the at least one latch device rotate between an opened position and a closed position.

9. The burn-in socket as claimed in claim 8, wherein each latch device includes a latching member and a rotating shaft to pivotally assemble the latching member on the socket body.

10. The burn-in socket as claimed in claim 9, wherein the latching member has a pressing portion with a cuneiform outside surface and a locking portion extending inwardly from the pressing portion.

11. The burn-in socket as claimed in claim 9, wherein when the movable frame moves downwardly, the actuating member downwardly pushes the cuneiform outside surface of the pressing portion of the latching member to rotate the latching member to the opening position.

12. The burn-in socket as claimed in claim 8, wherein the movable frame is made of insulating material, the actuating member is made of metal, and the actuating member is inserted into the movable frame.

13. The burn-in socket as claimed in claim 8, wherein the socket body includes a base, a securing frame seated on the base, and a retaining board received in the securing frame for retaining the contacts.

14. The burn-in socket as claimed in claim 8, wherein the movable frame defines a plurality of flat roofs respectively downwardly recessed from a center part of sidewalls thereof for receiving the actuating member.

15. A burn-in socket comprising:
   a socket body for carrying the semiconductor package;
   a plurality of contacts received in the socket body for electrically connecting to the semiconductor package;
   an insulative frame up and down moveably mounted to the base;
   an insulative latch device pivotally mounted to the base and actuated by the frame, said latch device including a latching member having a pressing portion with a ramped outside surface which confronts an inside surface of a side wall of the frame; and
   a metallic actuating member formed between the ramped outside surface and the inside surface and constantly intimately associated with one of said latch device and said frame.

16. The burn-in socket as claimed in claim 15, wherein the actuating member is attached to the frame and includes an upper horizontal section for upward engagement with the latching member when said latching member is located at an outer open position, and a lower vertical section for sideward engagement with the latching member when said latching member is located at an inner closed position.

* * * * *